United States Patent [19]

Zarka et al.

[11] Patent Number: 5,413,067
[45] Date of Patent: May 9, 1995

[54] METHOD OF OBTAINING A CRYSTAL BY CRYSTAL GROWTH IN THE LIQUID PHASE FROM A SEED

[75] Inventors: Albert Zarka, Paris; Jacques Detaint, Villemomble; Jacquie Schwartzel, Palaiseau; Yves Toudic, Lannion; Bernard Capelle, Antony; Yun L. Zheng, Ivry sur Seine; Etienne Philippot, Saint Mathieu de Trevier; Xavier Buisson, Annecy le Vieux; Roger Arnaud, Crangevrier, all of France

[73] Assignee: France Telecom & Centre National de la Recherche Scientifique (CNRS), Paris, France

[21] Appl. No.: 976,280

[22] Filed: Nov. 13, 1992

[30] Foreign Application Priority Data

Nov. 14, 1991 [FR] France .................................. 91 14007

[51] Int. Cl.[6] ............................................. C30B 29/18
[52] U.S. Cl. ........................................ 117/54; 117/63; 117/912; 117/943; 423/339
[58] Field of Search ............ 156/621, 623 Q, DIG. 65, 156/620.7, 620.73, 620.74; 423/339; 117/72, 912, 54, 63, 64, 943

[56] References Cited

U.S. PATENT DOCUMENTS

| | | | |
|---|---|---|---|
| 2,456,831 | 12/1948 | Kjellgren | 156/621 |
| 2,923,605 | 2/1960 | Jaffe et al. | 23/301 |
| 4,000,560 | 12/1988 | Gualtieri | 156/601 |
| 4,576,808 | 3/1986 | Armington et al. | 423/335 |

OTHER PUBLICATIONS

"The Influence of the Sector Location of the Seed on the Quality of a Synthetic Quartz Crystal"; Zarka et al.; J. of Cryst. Growth 54 (1981) pp. 394–398.

Primary Examiner—R. Bruce Breneman
Assistant Examiner—Felisa Garrett
Attorney, Agent, or Firm—Blakely, Sokoloff, Taylor & Zafman

[57] ABSTRACT

A method of obtaining a crystal by crystal growth in the liquid phase from a seed in the form of a plate taken from a primary crystal, which method comprises at least two steps constituted firstly by forming first crystal growth to obtain a secondary crystal from a first seed taken from said primary crystal in a first growth zone, and secondly in performing second crystal growth from a second seed taken from said secondary crystal in a second growth zone, said first and second seeds being selected so that few of the dislocations that they contain propagate respectively into the second zone of the secondary crystal or into the first growth zone of the resulting crystal. According to the invention said first and second crystal growth steps are performed in different growth directions. Application to monocrystals of quartz, or of materials that are isomorphs of quartz, such as berlinite, and that are intended for use in making electronic components, in particular oscillators and filters.

5 Claims, 5 Drawing Sheets

METHOD OF OBTAINING A CRYSTAL BY CRYSTAL GROWTH IN THE LIQUID PHASE FROM A SEED

The present invention relates to a method of obtaining a crystal by crystal growth in the liquid phase from a seed.

A particularly advantageous application of the invention is to be found in preparing monocrystals of quartz or of materials that are isomorphs of quartz, such as berlinite, for use in making electronic components, in particular oscillators and filters.

BACKGROUND OF THE INVENTION

The advantage of using quartz in electronics is now well known for obtaining oscillators that are stable and for making filters. The use of this material is expanding very rapidly at present and billions of quartz-based devices are now manufactured each year in the world. The advantage of quartz analogues is that they have frequency stability and Q-factors similar to those obtained using quartz while also possessing piezoelectric properties that are greater, thus making it possible to make filters with much larger relative bandwidth, and also oscillators that are capable of being frequency offset much than is possible using quartz.

Berlinite, a monocrystal of the alpha phase of aluminum phosphate ($ALPO_4$), is the quartz isostructural compound that has been most developed. It has the advantage of enabling filters to be obtained with twice the bandwidth and oscillators that can be offset twice as far as those that use quartz. Berlinite is the material most suitable for making the intermediate frequency filters for the future pan-European digital radio telephone that requires a passband of 200 kHz to 70 MHz. With berlinite, as with quartz, an important characteristic is crystals of large size and of very good quality suitable for making devices that use said material under conditions that are economically favorable. Other crystallographic analogues of quartz are being developed ($GaPO_4$, $AlAsO_4$, $FePO_4$, etc.), and they have the same advantages as berlinite, sometimes to an even greater extent.

For quartz, as for analogues thereof, the common crystal orientations that are the most advantageous for applications are the AT, BT, SC, IT, and ST cuts. To obtain plates having said orientations and crystal morphologies that are the most advantageous for applications from the cost point of view, it is most common to use the following:

for quartz, seeds that are oriented normally to the optical axis z, that are long in the y direction, and that are considerably shorter along the x axis. In some cases, it is also possible to use seeds having the same orientation but that are long in the x direction and short along the y axis. Seeds whose thickness is normal to the various natural faces of the rhombohedron may also be of significant advantage.

for berlinite, parallelepiped-shaped seeds that are oriented normally to the electrical axis x, that are long in the y axis direction, and that are of small height and thickness in the optical axis direction z. It is also possible to use seeds that are oriented normally to the z axis.

In certain special cases, that are less common, other types of seed may be used, and this applies in particular to quartz when it is necessary either to obtain plates that are very large and of a shape that is not compatible with using a Z seed crystal, or to obtain plates having special crystal orientations more cheaply.

Hydrothermal growth methods allow a large quantity of crystals to be obtained in a single operation and thus under cost conditions that are highly favorable. They often lead to quite good crystal quality. For materials having phase transitions between ambient temperature and their melting point, such methods are among the few methods that can be used.

Several hydrothermal growth methods are known for quartz. They use alkaline solutions of sodium carbonate or of sodium hydroxide. In such solvents, quartz solubility is direct (and increases with temperature) such that the mother body placed in the hot bottom portion (at about 673 K) of the autoclave dissolves in the form of silicate. The solution is transported by convection towards the cold portion (temperature about 50° C. lower than the hot portion) where it desaturates by depositing quartz on the seeds. The conditions that give rise to a pure material (low OH and Al content) are conditions where temperatures and pressures are high and speeds are moderate (a few tenths of a millimeter per day and per face). These conditions are also conditions that give rise to low dislocation density.

In practice, the seeds are generally parallelepiped-shaped plates having sides of very different dimensions. Their length L is generally chosen to lie in the crystal direction that has the slowest rate of growth (y for quartz and berlinite) and their thickness (generally in the range 0.5 to a few mm) lies in the useful growth direction that is to be enhanced, while their width 1 (often called "seed height" and equal to about 10 mm to 50 mm for quartz) is usually chosen as a function of the applications intended, and in this case this parameter (like the growth times) can be used to optimize the size and the quantity of seeds obtained.

Recent work has shown that the presence of extensive faults (and in particular dislocations) has a large effect on the operation of highest performance piezoelectric devices.

In addition, the industry is making use of collective manufacturing techniques for said devices by chemically cutting or etching wafer of quartz or of its analogues. The yield of the corresponding operations is usually severely affected by the presence of dislocations in the material used, which give rise to localized etching anomalies ("etch pits", "etch channels").

Various methods have been proposed to improve not only the impurity concentration (such as point defects associated with hydrogen, lithium, sodium, etc.), but also to reduce the increase in the number of dislocations in quartz crystal, in particular by varying the intrinsic conditions of crystal growth (solution, temperature, pressure, seed orientation, . . . ).

However such improvements have been too small or have required the use of experimental conditions that are too severe.

Two techniques are known for obtaining quartz crystals having low dislocation density. Under such circumstances, growth is usually performed using Z orientation seeds since the morphology of the resulting crystals is favorable to obtaining those crystal orientations that are used most often (AT, BT, ST, SC, etc.) and the Z growth zones then used have qualities that are advantageous from the impurity concentration point of view.

The technique most widely used relies on the use of seeds that possess such quality themselves and that have been obtained by a small number of successive growths made on a seed taken from a natural quartz crystal (which material has extremely low concentration dislocations). In the prior art, the successive growths are formed along the optical axis, and dislocations existing in the seed propagate during growth so that their density cannot decrease. In practice density increases quickly depending on the quality of growth conditions, because of new dislocations appearing at the seed-growth interface, or in the growth itself (together with the existence of inclusions that are difficult to avoid altogether).

Using that technique on an industrial scale to obtain crystals having a very low concentration of dislocations therefore requires frequent regeneration of seed quality by using natural quartz. Economically speaking, this makes the method very expensive (large natural crystals are expensive).

For other materials obtained using the hydrothermal technique and for which large-sized natural crystals of great perfection do not exist, the above method cannot be applied.

In 1981, following fundamental work on the influence of sector localization of the seed by A. Zarka et al. (A. Zarka, Liu Lin, X. Buisson, "The influence of sector localization of the seed on the crystal quality of synthetic quartz", published in J. Cryst. Growth, Vol. 54, pp. 384–398 (1981)) propose a novel technique making it possible for the first time to genuinely reduce the density of dislocations without making massive use of expensive natural crystals. That technique of growing synthetic quartz is illustrated in accompanying FIG. 1 to 3.

FIG. 1 is a section perpendicular to the y direction through a crystal of synthetic quartz made from a seed whose thickness extends normally to the usual growth direction, i.e. the z direction.

FIG. 2 shows the result obtained after growth from the seed G1 shown in FIG. 1.

FIG. 3 shows the crystal obtained after growth from the seed G2 shown in FIG. 2.

In the prior art, the seeds G2 (FIG. 2) are Z plates taken from the X or S growth zones of a synthetic crystal made conventionally using a Z type seed G1 (FIG. 1) from the above-mentioned growth method. It can be seen in FIG. 2 that the dislocations 11 that existed in the seed G1 extend into the zone Z. Additional dislocations may exist in the Z zones, due, for example, to solid inclusions trapped at the beginning of growth. Dislocation density therefore increases with successive generations.

In that case, few dislocations 12 (FIG. 3) existing in the seed G2 obtained in this way extend in the Z zones of the new growth, and it is possible to obtain crystals having a very low dislocation density. The quality of this method has been checked by X-ray topographical investigation. Furthermore, the method has the advantage of taking seeds from zones of growth that are not used for making devices, and which are in any case cut off during initial cutting.

Using said technique, the best zone for cutting out the seed G2 is the zone X (FIG. 2). In quartz crystals, X zones are either small in height (crystals obtained under conditions that give rise to high rates of growth in the z direction in an NaOH or an $Na_2CO_3$ medium), or else they are small in width (crystals obtained using small rates of growth under conditions that lead to high intrinsic Q-factor). As a result, in that method, either it is difficult to obtain seeds of great height, or else it is possible to obtain only a very small number of seeds per crystal.

With reference to FIG. 2, it should be observed that only a very small number of G2 type seeds can be obtained per crystal.

Thus, the technical problem to be solved by the present invention is to provide a method of obtaining a crystal by performing crystal growth in the liquid phase on a seed, which method makes it possible to solve the problem of dislocation density while avoiding systematic use of natural crystals, and secondly to provide a significant number of seeds, which is an important point when producing crystals having low dislocation density on an industrial scale.

SUMMARY OF THE INVENTION

According to the present invention, the solution to the technical problem posed is provided by a method of obtaining a crystal by crystal growth in the liquid phase from a seed in the form of a plate taken from a primary crystal, which method comprises at least two steps constituted firstly by forming first crystal growth to obtain a secondary crystal from a first seed taken from said primary crystal in a first growth zone, and secondly in performing second crystal growth from a second seed taken from said secondary crystal in a second growth zone, said first and second seeds being selected so that few of the dislocations that they contain propagate respectively into the second zone of the secondary crystal or into the first growth zone of the resulting crystal, the method being remarkable in that said first and second crystal growth steps are performed in different growth directions.

Preferably, said growth directions are substantially perpendicular.

In this "crossed-growth" method, the said first and second seeds at each of the steps are taken in such a manner as to ensure that they are practically free of dislocations or that the dislocations they do contain are substantially normal to the growth directions to which they respectively give rise, i.e. usually the width direction of the seed. In addition, they are taken from growth zones (regions) selected so that a large quantity of first and second seeds can be taken at each step.

In addition, an operation of partially metal plating the seeds may be used during one or more of the successive growth operations in order to further limit the propagation of dislocations in the seed. This operation consists in masking a portion of the surface of the seed by a thin layer (e.g. of metal) which is etched so as to leave discontinuous islands of small area on its surface. Experience has shown that under such conditions growth takes place normally providing various parameters (nature of the layer, thickness, size of the islands, etc.) are chosen appropriately and also that the dislocations existing in the masked zones of the seed do not propagate. The use of this technique can, of itself, reduce dislocation density by a factor close to 2 on each operation, and it is most advantageous when successive growth directions are not perpendicular.

With quartz, it is satisfactory to deposit thin layers of silver or gold having a thickness of a few thousands of angstroms and themselves deposited on a sublayer of nickel chromium alloy. For aluminum phosphate, thin layers of platinum, gold, etc., can be used. Advantageously, the metallization points do not exceed 0.75 mm in diameter and the metallized portion covers 30% to 60% of the total area.

The above explanation for quartz crystals is naturally applicable to other crystals. The major advantage of the method proposed and its efficiency have also been verified when using aluminum phosphate. It is quite possible to use crossed-growth to improve the quality of other crystals obtained by hydrothermal growth or by growth in solution (such as GaPO$_4$, TGS, KDP, etc.), providing the zones from which seeds are taken and the successive growth directions are selected appropriately. The principle on which growth is based should then be taken from the principle described above for quartz.

BRIEF DESCRIPTION OF THE DRAWINGS

Implementations of the invention are described by way of example with reference to the accompanying drawings, in which.

DETAILED DESCRIPTION

Figure 4:
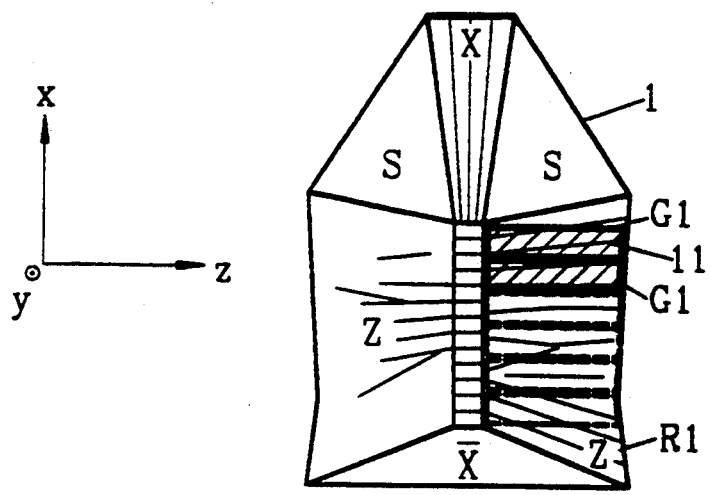
FIG. 4 is a section view perpendicular to the direction of a primary crystal of quartz made from a seed of thickness extending normally to the growth direction z.

An implementation of the crossed-growth method of the invention relating to Z-growth synthetic quartz is initially described with reference to FIGS. 4 to 6.

Figure 1:
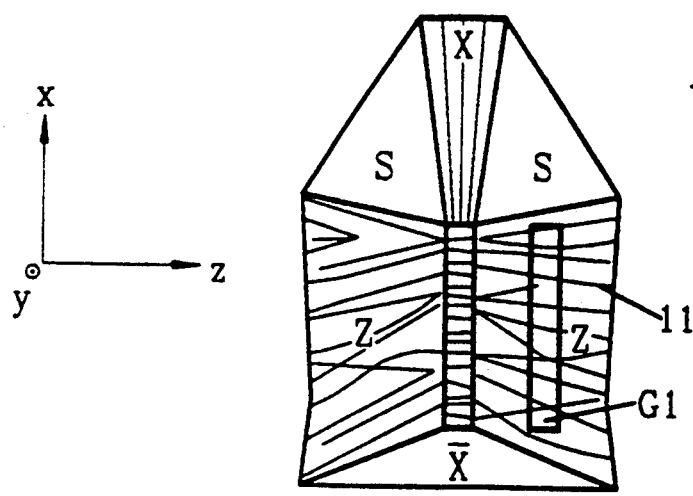
FIGS. 1 to 3 are described above.
Figure 2:
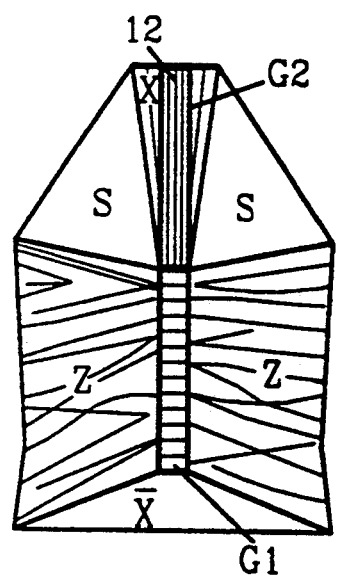
Figure 3:
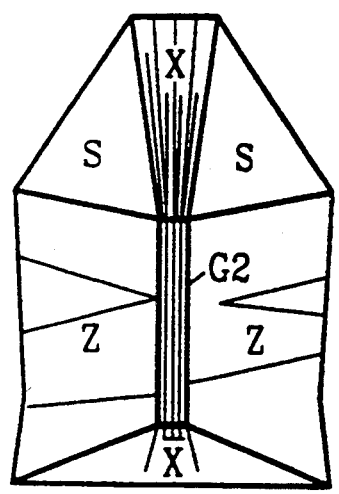

Starting from a conventional synthetic primary crystal 1 grown from a Z seed, seeds G1 of thickness normal to the x direction are taken in a first Z-type growth zone R1. It is thus possible to obtain a much larger number of seeds G1 than in the method described with reference to FIGS. 1 to 3. Crystals having the morphology shown in FIG. 4 in section on the xz plane are obtained by growing secondary crystals 2 from said seeds G1. Few of the dislocations 11 present in the seeds G1 propagate into the zones +X and −X of the resulting crystals. It is nevertheless well known that growth accidents may give rise to some dislocations being created in the zones Z and X.

Figure 5:
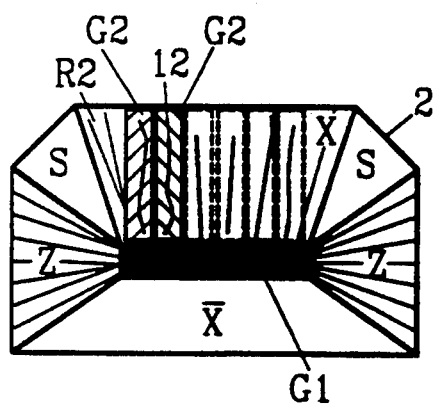
FIG. 5 is a section analogous to FIG. 4 through a secondary quartz crystal made from a seed G1 shown in FIG. 4 by growth in the x direction.
Figure 6:
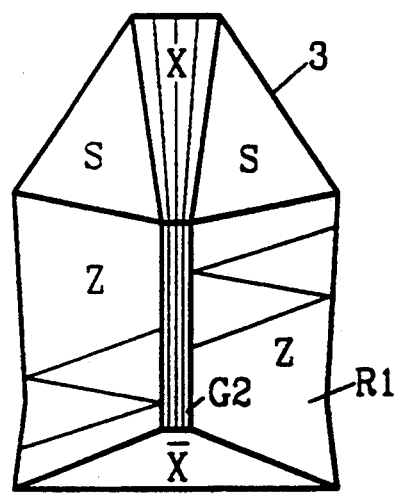
FIG. 6 is a section analogous to FIG. 4 through a quartz crystal made from a seed G2 shown in FIG. 5 and obtained by crossed-growth, in the z direction.

In order to further improve the quality of the crystals, further growth is performed from seeds G2 of thickness normal to z, which are cut out from a second X-type growth zone R2 (FIG. 5). Here again, a large quantity of the seeds G2 may be obtained, thereby ensuring a high multiplication coefficient for seeds, which is most favorable economically speaking. Growth of said seeds under conditions that enable high Q-factors to be obtained makes it possible to manufacture crystals 3 having low dislocation density in the Z zone and which are most advantageous for making very high performance resonators or for obtaining very high frequency resonators by chemical etching (FIG. 6).

A second implementation of the method of the invention applicable to synthetic quartz grown on a 01.1 seed (z face of the rhombohedron) is now described with reference to FIGS. 7 to 10.

This type of growth is very useful when it is desired to obtain very large AT or ST cut plates, e.g. for collective manufacture of bulk wave devices or of surface wave devices on a wafer.

Figure 7:
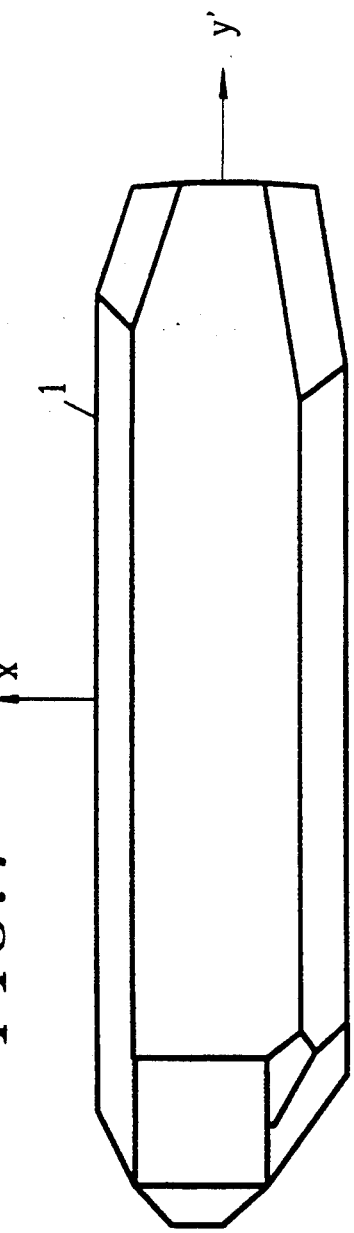
FIG. 7 is a view along the z axis of a primary quartz crystal made using a seed having an orientation of Y−38°13′ (z face of the rhombohedron), having its width in the x direction, and having its length in the y′ direction.
Figure 10:
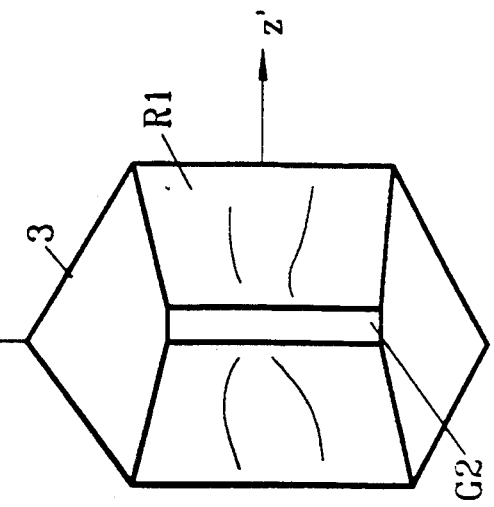
FIG. 10 is a section analogous to FIG. 8 through a quartz crystal made from a seed G2 shown in FIG. 9, by crossed-growth in the direction z′.
Figure 9:
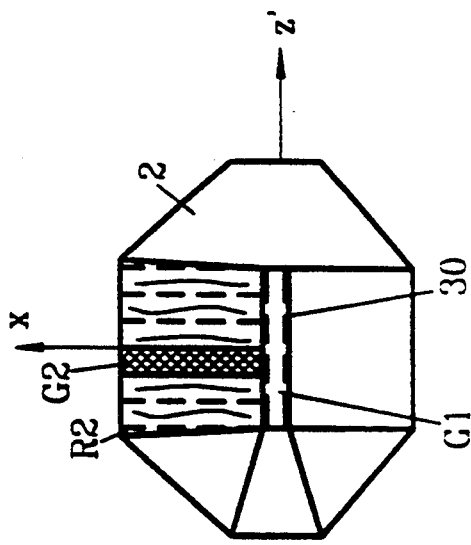
FIG. 9 is a section analogous to FIG. 8 through a secondary quartz crystal grown from a seed G1 shown in FIG. 8 in the x direction.
Figure 8:
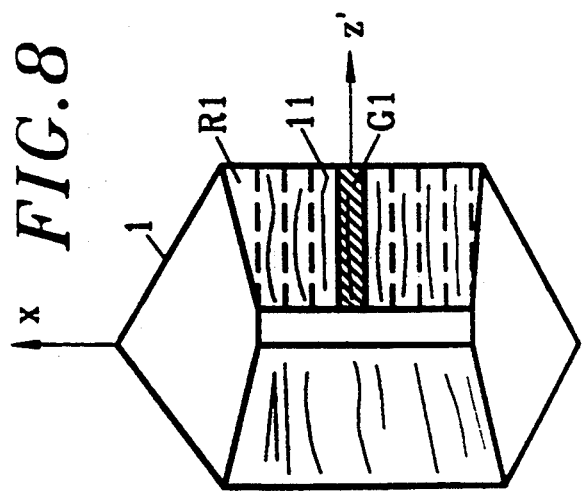
FIG. 8 is a section view on a plane perpendicular to the y′ direction through the primary crystal of FIG. 7.
Figure 11:
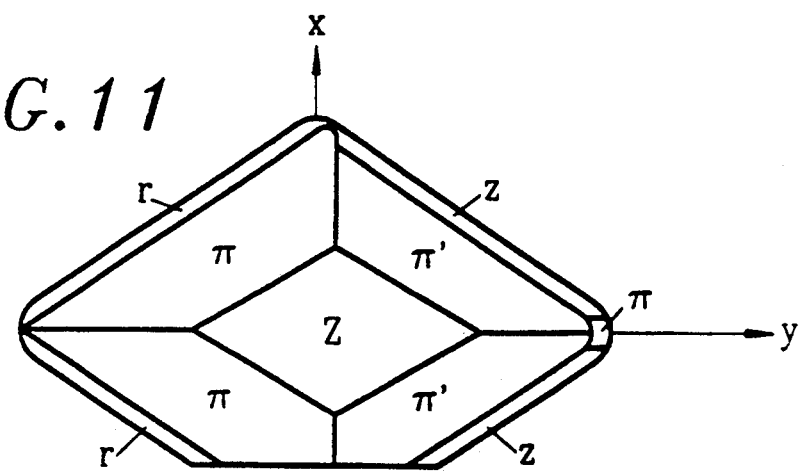
FIGS. 11 and 12 are views along the z axis and the x axis respectively of a crystal of berlinite having Z seeds.
Figure 12:
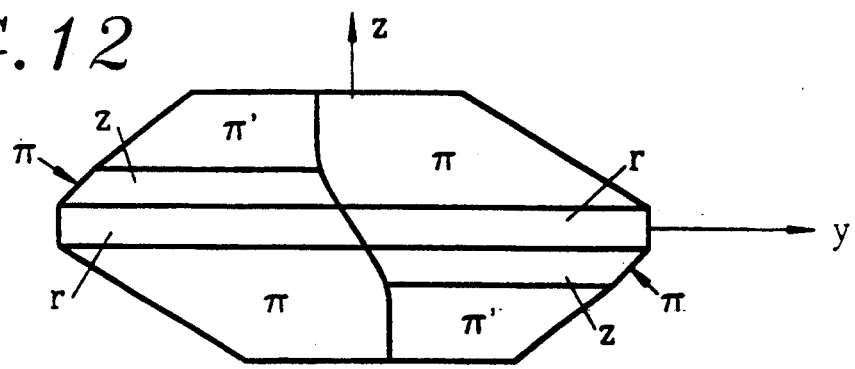
Figure 13:
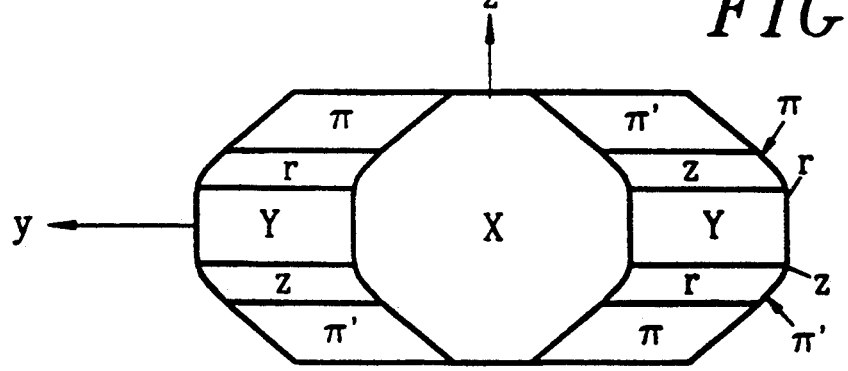
FIGS. 13 and 14 are views along the x axis and the z axis respectively of a crystal of berlinite having X seeds.
Figure 14:
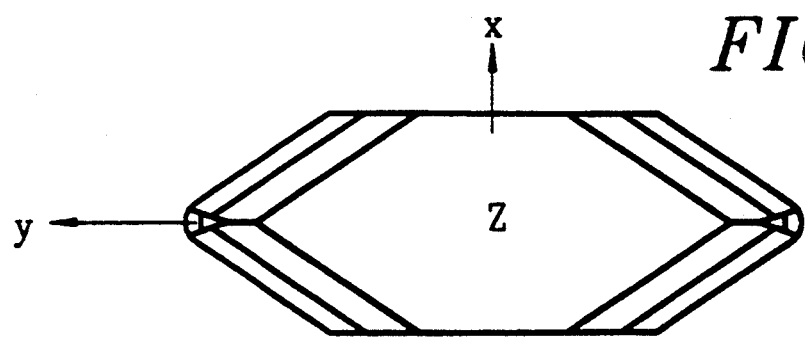

Starting from a primary crystal 1 of said type having the morphology shown in FIG. 7, seeds G1 of primary thickness normal to the axis x are cut as shown in FIG. 8. The length of these seeds extends in the same direction y′ as the length of the initial seed (which direction lies in the yz plane and is at an angle of about −38° to the z axis). A 0.04 μm thick layer 30 of nichrom followed by a 0.5 μm thick layer of silver (FIG. 9) is vacuum deposited on the X face of the seeds G1. Using a screen made up of points having a diameter of 0.5 mm and spaced apart from one another by spaces that occupy about 50% of the surface area, the same pattern is applied to the metal-coated surface by photolithography. Crystals having the morphology shown in FIG. 9 in a section normal to y′ have been obtained by growth which have X zones having a dislocation density that is already very low. Seeds G2 of orientation identical to that of the starting crystal have then been cut from said crystals, thereby making it possible to obtain crystals 3 (FIG. 10) of the same type as the starting crystals but having dislocation densities in the zones used for cutting out AT cut or ST cut wafers that are very low, thereby making it possible to obtain high yields for making devices by collective methods that implement photolithography, thinning, and chemical cutting out.

A particular implementation of the method of the invention applicable to growing aluminum phosphate (berlinite) is described with reference to FIGS. 11 to 16.

The morphology of berlinite crystals (FIGS. 11, 12, 13, and 14) regardless of whether they are obtained using Z orientation seeds (FIGS. 11 and 12) or X orientation seeds (FIGS. 13 and 14) is substantially identical to that of quartz. The increase in the y direction during each growth is extremely small. Since this material exists in the natural state in the form of very small crystals only that are unsuitable for obtaining large crystals with a high degree of perfection using the prior art known for quartz, it is important to use methods that conserve length and that improve crystal quality. Long crystals are obtained under conditions of synthesis that may be quite different (in temperature, concentration, pressure, etc.) from those used when producing crystals having a good Q-factor.

To improve crystal quality significantly, variants of the "crossed-growth" method of the invention are used, depending on the type of crystal.

Starting from a primary crystal 1 obtained from a seed whose orientation is normal to the x axis (FIG. 15), first seeds G1 of orientation normal to the z axis are taken from the first zone R1 of X-type growth for said primary crystal to serve as new seeds. After growth (FIG. 16), second seeds G2 of orientation normal to the x axis (i.e. a direction perpendicular to the preceding direction of growth) are taken from a second zone R2 of Z-type growth on either side of the first seed G1 (and omitting said seed). If necessary, these plates can be used for performing further crossed-growth operations in which growth directions are crossed to improve crystal quality, or else they may be used as seeds for making high Q-factor crystals for use in manufacturing resonators or filters.

Figure 15:
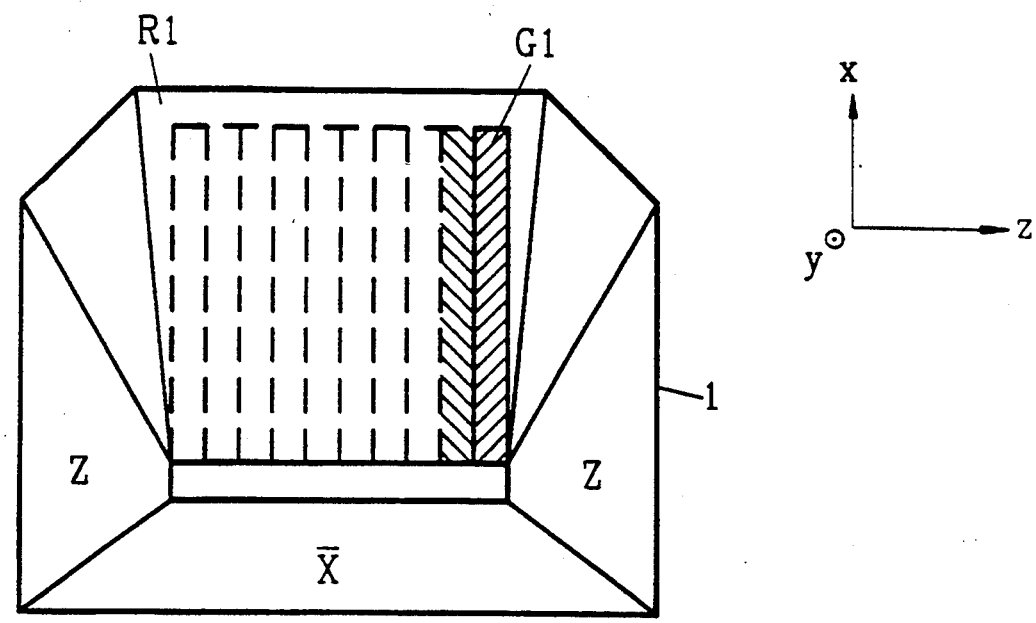
FIG. 15 is a section view on a plane perpendicular to the y direction through a primary crystal of berlinite.
Figure 16:
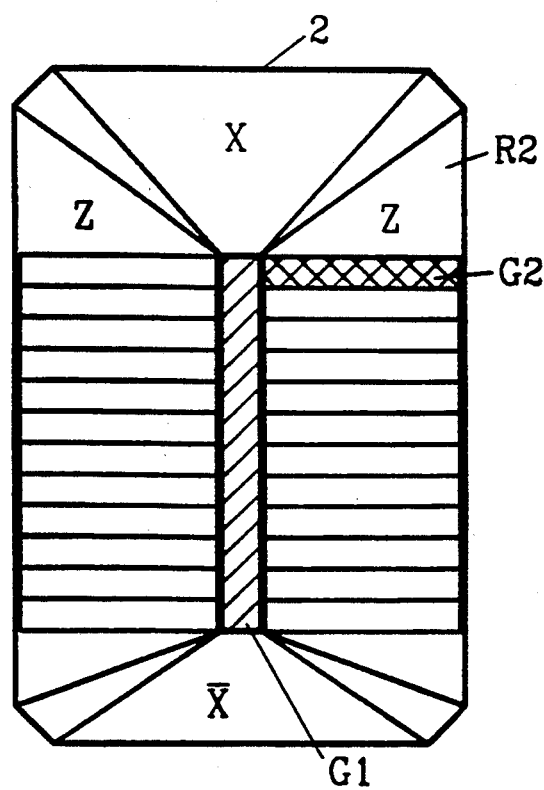
FIG. 16 is a section view analogous to that of FIG. 15 for a secondary crystal of berlinite.

When the crystal from which an improvement in crystal quality is desired has been obtained using a seed of orientation normal to the z axis in the first operation, the seeds are taken (omitting the initial seed) in such a manner as to have a direction normal to the x axis (FIG. 16), i.e. perpendicular to the direction in which the previous growth took place. Starting from crystals obtained by growing said seeds, another generation of seeds is cut out from the X zone so that the useful growth direction is perpendicular to the preceding growth direction, i.e. in this case, normal to the z axis (FIG. 15). A second step of crystal quality improvement is performed by growth from said seeds either to obtain high Q-factor crystals directly for use in manufacturing devices, or else for obtaining crystals that enable the operation of improving crystal quality to be obtained by further crossings of the growth direction.

The number of times crossed-growth is performed is determined solely by the looked-for crystal quality. As with quartz, each step of the operation provides a significant improvement of crystal quality while simultaneously multiplying the number of seeds by a large number. As a general rule, two growths alternately in the two directions indicated suffice for obtaining crystals having low dislocation density.

We claim:

1. A method for obtaining a crystal by crystal growth in the liquid phase from a seed in the form of a plate taken from a primary crystal, which method comprises the steps of:

taking a first seed plate from said primary crystal in a first growth zone or sector, said first seed plate having a thickness which lies perpendicular to the direction of growth of said first growth zone and being elongated in said direction of growth;

forming a first crystal growth to obtain a secondary crystal from said first seed plate;

taking a second seed plate from said secondary crystal in a second growth zone, said second seed plate having a thickness which lies perpendicular to the direction of growth of said second growth zone and being elongated in said direction of growth; and forming a second crystal growth to obtain the final crystal from said second seed plate.

2. A method according to claim 1, wherein said directions of growth are substantially perpendicular.

3. A method according to claim 1, wherein said first and second seeds are taken in such a manner that the dislocations they contain are substantially normal to the respective crystal growth directions to which they give rise.

4. A method according to claim 1, wherein said first and second growth zones are chosen so that a plurality of first and second seeds can be taken from each step.

5. A method according to claim 1, including a metal-coating operation consisting in masking a portion of the surface of the seeds by a thin layer which is etched so as to leave discontinuous islands of small area on said surface.

* * * * *